(12) United States Patent
Ben-Tzur et al.

(10) Patent No.: US 6,977,217 B1
(45) Date of Patent: Dec. 20, 2005

(54) ALUMINUM-FILLED VIA STRUCTURE WITH BARRIER LAYER

(75) Inventors: Mira Ben-Tzur, Sunnyvale, CA (US); Gorley L. Lau, Fremont, CA (US); Ivan P. Ivanov, Apple Valley, MN (US); Feng Dai, San Jose, CA (US); Chan-Lon Yang, Los Gatos, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 49 days.

(21) Appl. No.: 10/308,410

(22) Filed: Dec. 3, 2002

(51) Int. Cl.⁷ .................. H01L 21/4763; H01L 21/44
(52) U.S. Cl. ................ 438/627; 438/637; 438/660; 438/688
(58) Field of Search ............... 438/637–640, 438/627, 643, 653, 688, 763, 798

(56) References Cited

U.S. PATENT DOCUMENTS

| | | | |
|---|---|---|---|
| 5,305,519 A * | 4/1994 | Yamamoto et al. | 438/623 |
| 5,668,398 A | 9/1997 | Havemann et al. | |
| 5,918,149 A | 6/1999 | Besser et al. | |
| 5,962,923 A * | 10/1999 | Xu et al. | 257/774 |
| 5,963,830 A | 10/1999 | Wang et al. | |
| 5,998,296 A * | 12/1999 | Saran et al. | 438/685 |
| 6,004,876 A * | 12/1999 | Kwon et al. | 438/636 |
| 6,075,293 A * | 6/2000 | Li et al. | 257/763 |
| 6,120,844 A | 9/2000 | Chen et al. | |
| 6,132,564 A * | 10/2000 | Licata | 204/192.15 |
| 6,136,709 A | 10/2000 | Schmidbauer et al. | |
| 6,204,200 B1 | 3/2001 | Shieh et al. | |
| 6,368,880 B2 | 4/2002 | Singhvi et al. | |
| 6,411,349 B2 | 6/2002 | Nakazawa et al. | |

OTHER PUBLICATIONS

Advanced Interconnects, 2000 IEDM Short Course.

* cited by examiner

*Primary Examiner*—Ha Tran Nguyen
(74) *Attorney, Agent, or Firm*—Okamoto & Benedicto LLP

(57) ABSTRACT

In one embodiment, a via structure includes a liner, a barrier layer over the liner, and an aluminum layer over the barrier layer. The barrier layer helps minimize reaction between the aluminum layer and the liner, thus helping minimize void formation in the via. The liner and the barrier layer may be deposited in-situ by ionized metal plasma (IMP) physical vapor deposition (PVD). In one embodiment, the liner comprises titanium, while the barrier layer comprises titanium nitride.

9 Claims, 6 Drawing Sheets

ALUMINUM-FILLED VIA STRUCTURE WITH BARRIER LAYER

BACKGROUND OF THE INVENTION

1. Field of the Invention

The present invention relates generally to integrated circuits, and more particularly to integrated circuit fabrication processes and structures.

2. Description of the Background Art

In an integrated circuit, a "via" is employed to electrically couple a top metal layer to a bottom metal layer. Generally speaking, a via is a hole formed in a dielectric layer separating the top and bottom metal layers. To carry electrical signals from one metal layer to another, a via is filled with an electrically conductive material, such as aluminum or tungsten. As can be appreciated, a via needs to be structurally robust to reliably carry electrical signals. A defect in a via, such as a void, may lead to intermittent problems and, depending on the severity of the defect, may result in full circuit failure.

SUMMARY

In one embodiment, a via structure includes a liner, a barrier layer over the liner, and an aluminum layer over the barrier layer. The barrier layer helps minimize reaction between the aluminum layer and the liner, thus helping minimize void formation in the via. The liner and the barrier layer may be deposited in-situ by ionized metal plasma (IMP) physical vapor deposition (PVD). In one embodiment, the liner comprises titanium, while the barrier layer comprises titanium nitride.

These and other features of the present invention will be readily apparent to persons of ordinary skill in the art upon reading the entirety of this disclosure, which includes the accompanying drawings and claims.

The use of the same reference label in different drawings indicates the same or like components. Drawings are not to scale unless otherwise noted.

DETAILED DESCRIPTION

In the present disclosure, numerous specific details are provided such as examples of apparatus, process parameters, materials, process steps, and structures to provide a thorough understanding of embodiments of the invention. Persons of ordinary skill in the art will recognize, however, that the invention can be practiced without one or more of the specific details. In other instances, well-known details are not shown or described to avoid obscuring aspects of the invention. For example, masking steps are not shown or described for clarity of illustration.

Figure 1:
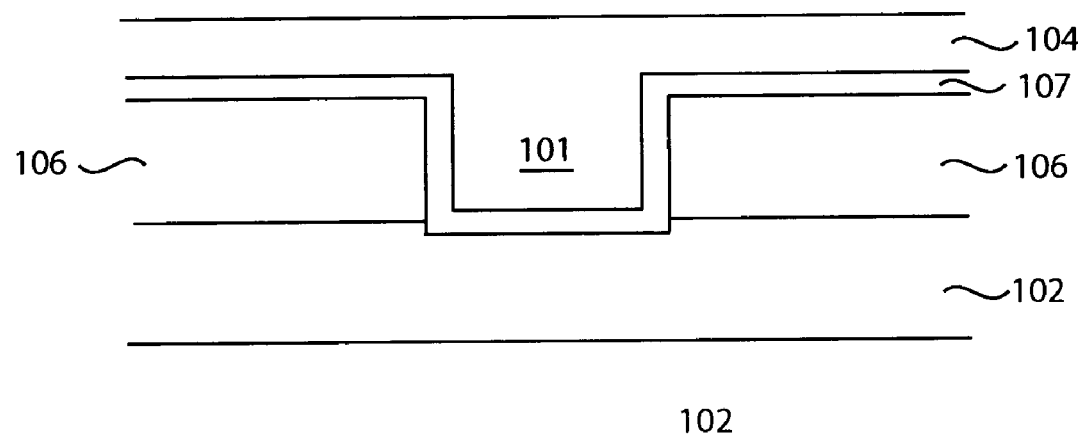
FIG. 1 schematically shows a portion of an integrated circuit including a via.

FIG. 1 schematically shows a portion of an integrated circuit including a via 101. Via 101 is formed in a dielectric layer 106 separating an aluminum layer 102 and an aluminum layer 104. Aluminum layer 102 may be a metal layer including an electrical circuit or an interconnect line. Similarly, aluminum layer 104 may be patterned and etched to include an electrical circuit or interconnect line. Each of aluminum layers 102 and 104 may be a single metal layer or a metal stack.

Via 101 electrically couples aluminum layer 102 to aluminum layer 104. Via 101 may be formed by etching dielectric layer 106 to a depth of about 3000 to 4000 Angstroms. Dielectric layer 106 may be a layer of silicon dioxide. Aluminum layer 104 may be deposited using a "hot aluminum" process, which may be a two step physical vapor deposition process involving physical vapor deposition of aluminum at room temperature followed by physical vapor deposition of aluminum at a temperature of about 450° C. to 480° C.

Still referring to FIG. 1, via 101 is filled with a titanium layer 107 and aluminum layer 104. Titanium layer 107, which serves as a liner, may be deposited by collimated magnetron sputter deposition. Titanium layer 107 aids in the deposition of aluminum layer 104 into via 101 by providing a wetting layer. Titanium layer 107 may be deposited to a thickness of about 300 Angstroms. Conventional via structures typically rely on the use of a titanium layer that is directly in contact with an aluminum layer to get adequate conformal coverage of aluminum in the via.

Although the via structure of FIG. 1 is satisfactory in most cases, the inventors have discovered that the use of aluminum and titanium in via 101 may lead to increased resistance and structural defects in the via. When subjected to temperatures higher than about 400° C., such as during deposition of aluminum layer 104, titanium reacts with aluminum in via 101 to form $Al_3Ti$. The resulting $Al_3Ti$ inter-metallic compound has a smaller volume than aluminum layer 104 and may also continue to shrink in subsequent high temperature processing steps. Because aluminum layer 104 is constrained by a passivation layer on one end (not shown) and a $Al_3Ti$ volume that has shrunk on the other end, aluminum layer 104 is under tensile stress. During storage or operation, aluminum layer 104 may go through stress relaxation that may lead to voids and structural defects in via 101. Besides introducing voids, $Al_3Ti$ may also increase resistance through via 101.

Figure 2A:
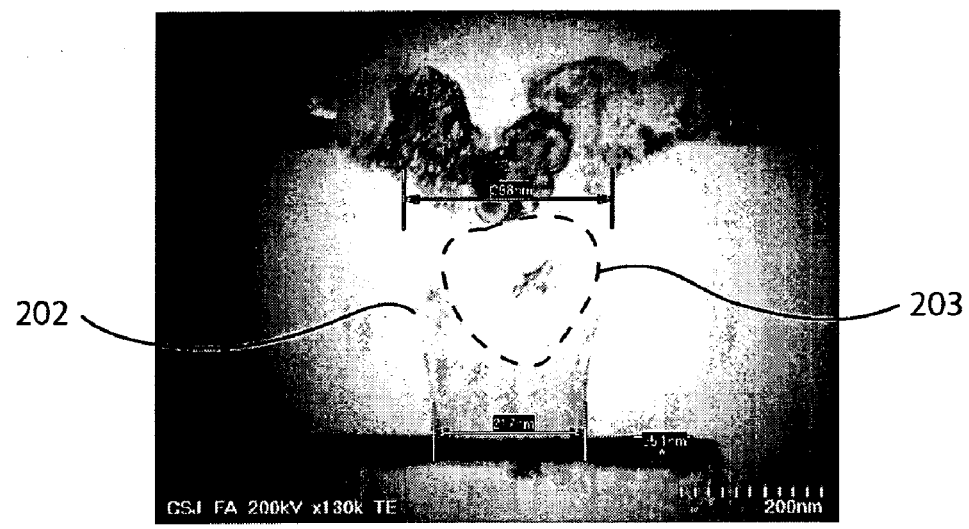
FIGS. 2(a) and 2(b) show transmission and scanning electron micrographs, respectively, of integrated circuits with voids in vias.
Figure 2B:

FIG. 2(a) shows a transmission electron micrograph (TEM) of a cross-sectional view of an integrated circuit with a via structure similar to that in FIG. 1. In FIG. 2(a), a via 202 is filled with aluminum that is directly in contact with a titanium liner. Reaction between aluminum and titanium in via 202 resulted in the formation of $Al_3Ti$, eventually resulting in a void generally enclosed by a dashed line 203. FIG. 2(b) shows a scanning electron micrograph of a side cross-sectional view of another integrated circuit with a similar problem. In FIG. 2(b), a via 204 is filled with aluminum that directly contacts a titanium liner, which lead to the formation of a void enclosed by a dashed line 205.

In accordance with an embodiment of the present invention, a via structure is made more robust by incorporating a barrier layer between a liner and a via-fill material, which also referred to as a "via metal". In one embodiment, a via structure includes a titanium liner separated from a via metal of aluminum by a barrier layer of titanium nitride. The titanium nitride serves as a wetting layer for the aluminum and also helps minimize reaction between the aluminum and the titanium, thus minimizing formation of $Al_3Ti$ in the via.

FIGS. 3(a)–3(e) show cross-sectional views of an integrated circuit being fabricated in accordance with an embodiment of the present invention. Beginning in FIG. 3(a), a dielectric layer 320 is deposited over a metal stack 310. It is to be noted that as used in the present disclosure, the terms "over", "overlying", "under" and "underlying" refer to the relative placement of two materials that may or may not be directly in contact with each other. That is, the two materials may be separated by another material. For example, another material may be placed between metal stack 310 and dielectric layer 320.

Dielectric layer 320 may be a layer of silicon dioxide deposited to a thickness of about 10,000 Angstroms by plasma enhanced chemical vapor deposition using TEOS as a precursor. A dielectric layer 320 of silicon dioxide may be polished to a thickness of about 3,000 to 4,000 Angstroms, preferably to about 3,500 Angstroms. Dielectric layer 320 may also be a low-k dielectric material, for example.

Figure 3A:
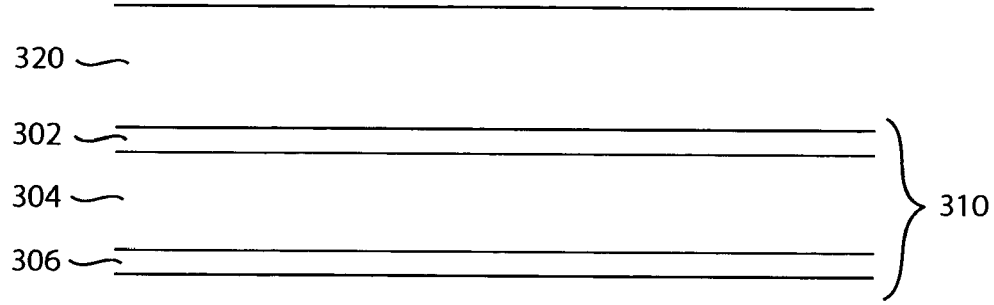
FIGS. 3(a)–3(e) show side cross-sectional views of an integrated circuit being fabricated in accordance with an embodiment of the present invention.

Still referring to FIG. 3(a), metal stack 310 may comprise a layer 306 (e.g., titanium, titanium tungsten, titanium/titanium tungsten, or titanium nitride), a metal layer 304, and a layer 302 (e.g., titanium tungsten, titanium/titanium tungsten, or titanium nitride). In one embodiment, layer 306 is a layer of titanium deposited to a thickness of about 150 Angstroms on a dielectric layer (not shown), while layer 302 is a titanium tungsten layer deposited to a thickness of about 300 Angstroms on metal layer 304. In one embodiment, metal layer 304 is a layer of aluminum deposited to a thickness of about 8000 Angstroms on layer 306. Layer 306, metal layer 304, and layer 302 may be deposited by physical vapor deposition, for example.

Figure 3B:
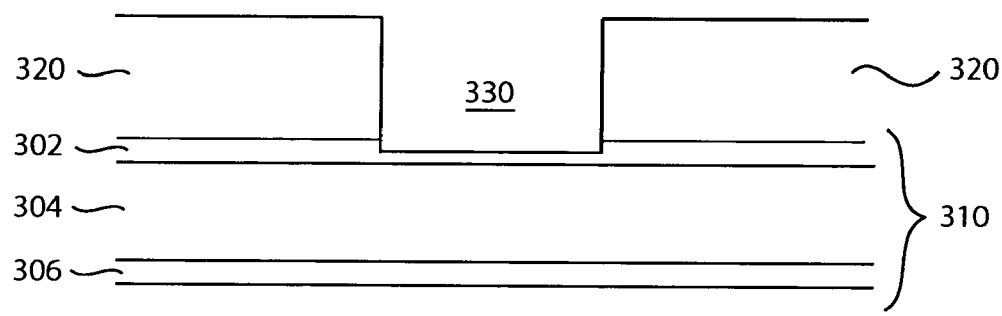

In FIG. 3(b), a via 330 is formed through dielectric layer 320. In the example of FIGS. 3(a)–3(e), via 330 is depicted as gouging part of layer 302. However, depending on the application, the via etch process for forming via 330 may also be designed to have enough selectivity to layer 302 to stop on layer 302. For example, the via etch process may have a selectivity of about 20:1 relative to layer 302. As a specific example, a dielectric layer 320 of silicon dioxide may be plasma etched to stop on a layer 302 of titanium tungsten using an etchant like $C_2H_2F_4$, Ar, $CHF_3$, $C_4F_8/CO$, or $CF_4$, or combination of the aforementioned etchants. This will help minimize reaction of a subsequently deposited liner 332 (see FIG. 3(c)) of titanium with an underlying metal layer 304 of aluminum.

Figure 3C:
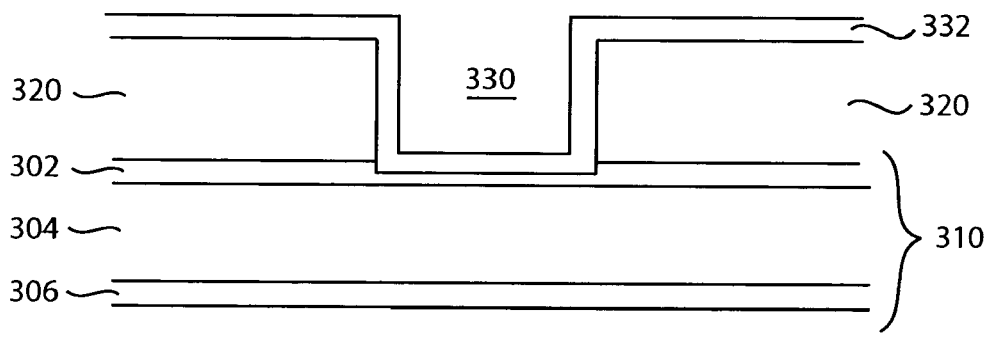

In FIG. 3(c), a liner 332 is deposited in via 330. Liner 332 helps facilitate filling of via 330 with aluminum. In one embodiment, liner 332 is a layer of titanium deposited to a thickness of about 150 Angstroms by ionized metal plasma (IMP) physical vapor deposition. IMP physical vapor deposition is a type of ionized magnetron sputter deposition. Device fabrication systems for performing IMP physical vapor deposition are commercially available from Applied Materials, Inc. of Santa Clara, Calif., for example.

Figure 3D:
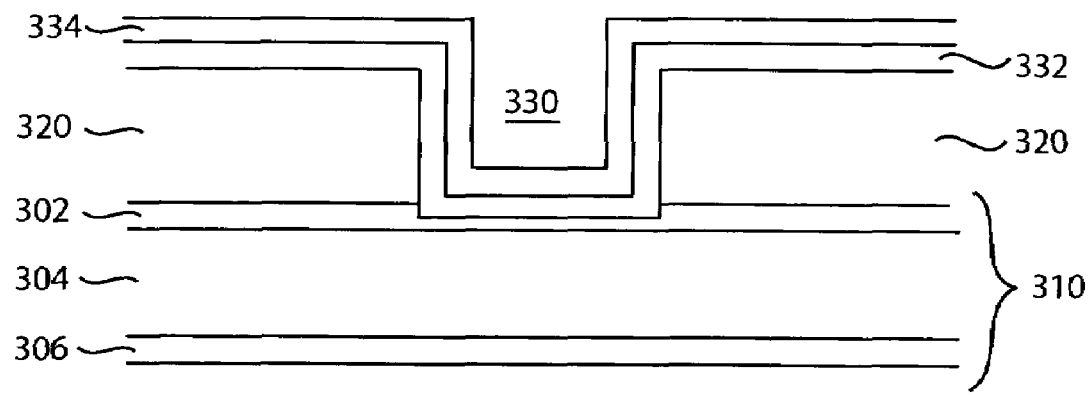

In FIG. 3(d), a barrier layer 334 is deposited over liner 332. Barrier layer 334 helps minimize reaction between liner 332 and a subsequently deposited via metal 340 (see FIG. 3(e)). Additionally, barrier layer 334 serves as a wetting layer for via metal 340. Preferably, barrier layer 334 does not appreciably react with metal 340. In one embodiment, barrier layer 334 is a layer of titanium nitride deposited to a thickness of about 150 Angstroms by IMP physical vapor deposition. A barrier layer 334 of titanium nitride helps minimize reaction between a liner 332 of titanium and a via metal 340 of aluminum, thus helping prevent formation of voids in via 330. Additionally, a barrier layer 334 of titanium nitride is a relatively good wetting layer for aluminum. Thus, unlike conventional via structures that use titanium as a wetting layer for aluminum, embodiments of the present invention allow for separation of titanium and aluminum in the via and still have adequate conformal coverage of aluminum in the via.

It is to be noted that liner 332 and barrier layer 334 may also be deposited using deposition technologies other than IMP physical vapor deposition. For example, liner 332 and barrier layer 334 may also be deposited using other types of physical vapor deposition process capable of depositing films that have adequate step coverage. For example, for a via that is about 3500 Angstroms tall and about 0.32 microns wide, a bottom coverage of about 50% and a sidewall coverage of about 20% may be adequate. However, liner 332 and barrier layer 334 are preferably deposited by IMP to ensure good step coverage and to allow for deposition of liner 332, barrier layer 334, and a via metal of aluminum in-situ (i.e., no vacuum break) in the same device fabrication system.

Figure 3E:
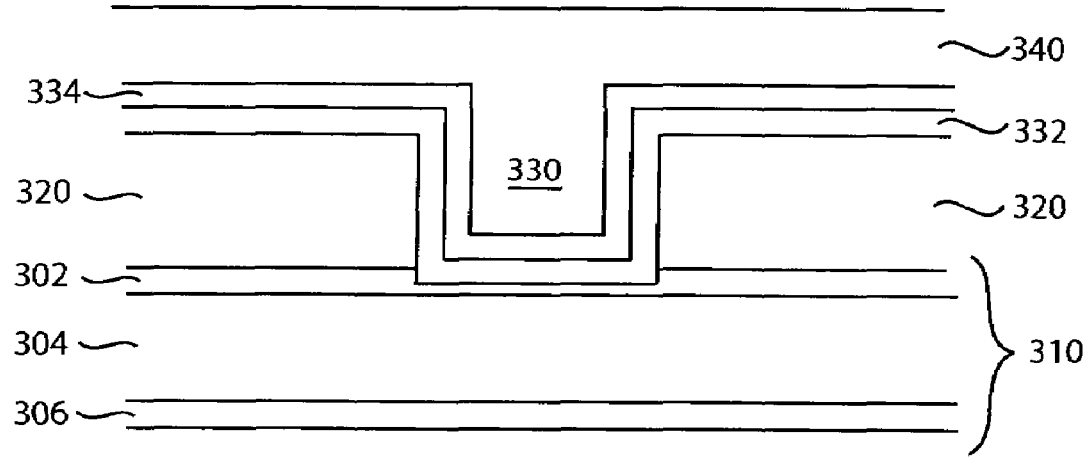

In FIG. 3(e), a via metal 340 is deposited in via 330. Via metal 340 not only fills via 330 but may also serve as a metal layer. For example, portions of via metal 340, barrier layer 334, and liner 332 over dielectric layer 320 may be etched away to form electrical circuits or interconnect lines. In one embodiment, via metal 340 comprises aluminum deposited using a two-step physical vapor deposition process having a "cold step" involving physical vapor deposition of aluminum at room temperature followed by a "hot step" involving physical vapor deposition of aluminum at a temperature of about 450° C. to 480° C.

Because of the presence of barrier layer 334 between liner 332 and via metal 340, reaction between the aforementioned layers of materials is minimized. The use of a barrier layer 334 of titanium nitride between a via metal 340 of aluminum and a liner 332 of titanium helps minimize formation of $Al_3Ti$ in via 330, which in turn helps minimize void formation and similar structural problems in the via.

Figure 4:
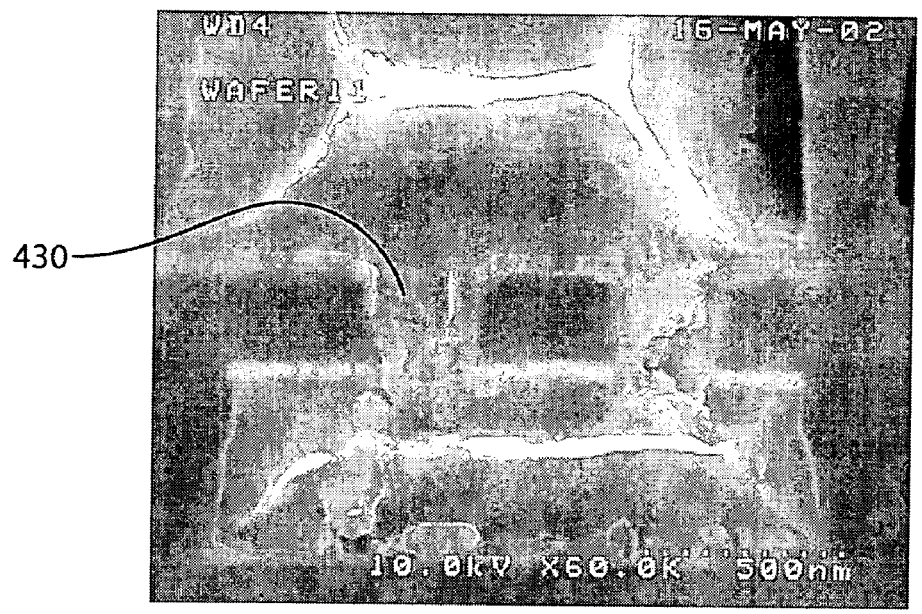
FIG. 4 shows a scanning electron micrograph of a side cross sectional view of an integrated circuit in accordance with an embodiment of the present invention.

FIG. 4 shows a scanning electron micrograph of a side cross sectional view of an integrated circuit in accordance with an embodiment of the present invention. In FIG. 4, a via 430 has a via metal of aluminum, a liner of titanium, and a barrier layer of titanium nitride between the aluminum and the titanium. Note the absence of voids in the micrograph of FIG. 4. (The shiny portions in the micrograph are not defects; the shiny portions are due to metal cleaving made in order to take the micrograph.)

It is to be noted that although tungsten is a popular material for filling vias, aluminum remains an important via-fill material. This is partly because aluminum is relatively more cost-effective to deposit than tungsten, and is thus more suitable for applications where cost saving is important, such as in some memory applications. As an example, a tungsten plug typically requires three process steps namely, seed layer deposition, tungsten deposition, and tungsten polish. The aforementioned tungsten plug process steps typically require the use of three separate device fabrication systems, which are also referred to as "tools". In contrast, in accordance with an embodiment of the present invention, aluminum via fill with a titanium liner and a titanium nitride barrier layer may be performed in-situ in a single multi-chamber tool referred to as a "cluster tool". For example, titanium, titanium nitride, and aluminum may be deposited using a single cluster tool commercially available from Applied Materials, Inc. of Santa Clara, Calif. Embodiments of the present invention thus allow for the use of aluminum as a cost-effective via fill material without the adverse effects of void formation in the via.

Figure 5:
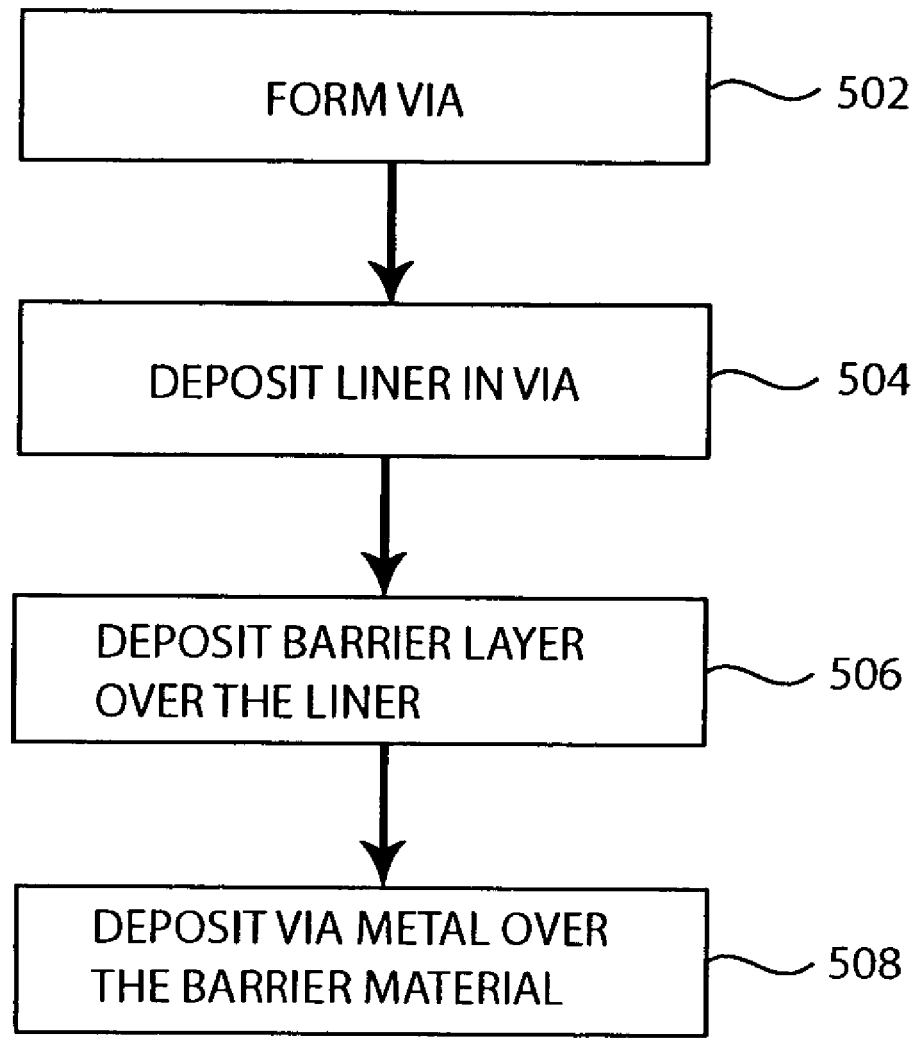
FIG. 5 shows a flow diagram of a method of filling a via structure in accordance with an embodiment of the present invention.

Referring now to FIG. 5, there is shown a flow diagram of a method of filing a via structure in accordance with an embodiment of the present invention. In step 502, a via is formed in a dielectric layer to electrically couple a first metal layer to a second metal layer. The first and second metal layers may include electrical circuits or interconnect lines.

In step 504, a liner is deposited in the via. In one embodiment, the liner comprises a layer of titanium.

In step 506, a barrier layer is deposited over the liner to minimize a reaction between the liner and a subsequently deposited via metal. The barrier layer preferably comprises a material that does not appreciably react with aluminum. In one embodiment, the barrier layer comprises titanium nitride. The liner and the barrier layer are preferably deposited by IMP.

In step 508, a via metal is deposited over the barrier layer to fill the via. In one embodiment, the via metal comprises aluminum. The liner, barrier layer, and via metal may be deposited in-situ for efficient process flow (and resultant cost-savings).

Table 1 shows representative results of via contact resistance measurements performed in one experiment. In the experiment, via structures with varying film thicknesses were fabricated. Referring to Table 1, sample no. 1 is a via structure that has a 150 Angstroms thick titanium liner and 150 Angstroms thick titanium nitride barrier layer, sample no. 2 is a via structure that has a 150 Angstroms thick titanium liner and 300 Angstroms thick titanium nitride barrier layer, sample no. 3 is a via structure that has a 300 Angstroms thick titanium liner and 150 Angstroms thick titanium nitride barrier layer, and sample no. 4 is a via structure that has a 300 Angstroms thick titanium liner and 300 Angstroms thick titanium nitride barrier layer. For each of samples 1–4, the titanium liner and titanium nitride barrier layer were deposited by IMP physical vapor deposition, while the via metal of aluminum was deposited by physical vapor deposition using a hot aluminum process.

In Table 1, "control" is a via structure that has a 300 Angstroms thick titanium liner and no barrier layer. The control via structure represents a conventional via structure and is provided for comparison purposes. For the control via structure, the titanium liner was deposited by collimated magnetron sputter deposition (instead of IMP); an aluminum via metal was deposited over the titanium liner by physical vapor deposition using a hot aluminum process.

Except for their respective via materials, samples 1–4 and the control via structure were otherwise the same. All the via structures were each configured for conventional via chain contact resistance measurements, which were performed after subjecting the via structures to a temperature of about 450° C. for about 30 minutes. The relative contact resistance values measured in the experiment are listed in Table 1.

TABLE 1

| Sample No. | Contact Resistance (Ohms) | Titanium Thickness (Angstroms) | Titanium Nitride Thickness (Angstroms) |
|---|---|---|---|
| 1 | 2.68 | 150 | 150 |
| 2 | 3.18 | 150 | 300 |
| 3 | 3.45 | 300 | 150 |
| 4 | 3.87 | 300 | 300 |
| Control | 2.83 | 300 | NONE |

As shown in Table 1, sample no. 1 resulted in the lowest contact resistance among the samples. Additionally, the contact resistance of sample no. 1 is comparable to that of the control via structure. This shows that a barrier layer may be employed to prevent void formation in a via without unduly increasing contact resistance. The results of Table 1 also indicate that increasing the thickness of the titanium liner or the titanium nitride barrier layer may also increase contact resistance (e.g., compare sample no. 1 to sample no. 3). Of course, the present invention is not limited to any particular material thickness. Embodiments of the present invention disclosed herein may be adapted for use with other materials, thicknesses, and process parameters to meet the needs of specific applications.

What is claimed is:

1. A method of filling a via structure, the method comprising:
    depositing a liner in a via;
    depositing a barrier layer in the via, the barrier layer comprising a material that does not substantially react with aluminum, wherein the liner and the barrier layer are deposited by ionized metal plasma (IMP) physical vapor deposition (PVD);
    depositing aluminum over the barrier layer in the via using a hot aluminum process, the hot aluminum process comprising a first PVD step at about room temperature followed by a second PVD step at a temperature higher than room temperature, the aluminum in the via being electrically coupled to an underlying metal stack comprising a titanium layer, an aluminum layer over the titanium layer, and a titanium tungsten layer over the aluminum layer;
    wherein the liner, the barrier layer, and the aluminum in the via are deposited in-situ in a same device fabrication system.

2. The method of claim 1 wherein the barrier layer comprises titanium nitride.

3. The method of claim 1 wherein the liner comprises titanium.

4. The method of claim 1 wherein the barrier layer and the liner are each deposited to a thickness of about 150 Angstroms or less.

5. The method of claim 1 wherein the via is formed in a layer of dielectric comprising silicon dioxide.

6. A method of forming a via, the method comprising:
    using an etch process to form a via, the etch process going through a dielectric layer and stopping before going all the way through a first layer that is directly on an aluminum layer, the aluminum layer being over a titanium layer, the first layer the aluminum layer, and the titanium layer forming a metal stack;
    depositing a liner over the first layer in the via;
    depositing a barrier layer over the liner, the barrier layer comprising a material that does not substantially react with aluminum; and
    depositing a metal comprising aluminum over the barrier layer in the via using a hot aluminum process, the hot aluminum process comprising a first physical vapor deposition step at about room temperature followed by a second physical vapor deposition step at a temperature higher than room temperature;
    wherein the liner, the barrier layer, and the aluminum in the via are deposited in-situ in a same device fabrication system.

7. The method of claim 6 wherein the etch process gouges into the first layer.

8. The method of claim 6 wherein the etch process stops on the first layer.

9. The method of claim 6 wherein the dielectric layer comprises silicon dioxide.

* * * * *